(12) United States Patent
Zeng

(10) Patent No.: US 12,063,828 B2
(45) Date of Patent: Aug. 13, 2024

(54) DISPLAY PANEL AND ELECTRONIC DEVICE HAVING POWER SUPPLY WIRE IN REDUNDANT PIXEL AREA ELECTRICALLY CONNECTED TO LIGHT-EMITTING FUNCTION LAYER

(71) Applicants: Huizhou China Star Optoelectronics Display Co., Ltd., Huizhou (CN); TCL China Star Optoelectronics Technology Co., Ltd., Shenzhen (CN)

(72) Inventor: Weijing Zeng, Huizhou (CN)

(73) Assignees: Huizhou China Star Optoelectronics Display Co., Ltd., Huizhou (CN); TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/435,073

(22) PCT Filed: Aug. 11, 2021

(86) PCT No.: PCT/CN2021/112130
§ 371 (c)(1),
(2) Date: Aug. 31, 2021

(87) PCT Pub. No.: WO2023/010603
PCT Pub. Date: Feb. 9, 2023

(65) Prior Publication Data
US 2024/0023388 A1    Jan. 18, 2024

(30) Foreign Application Priority Data

Aug. 4, 2021  (CN) .......................... 202110891220.8

(51) Int. Cl.
*H10K 59/131*  (2023.01)
*H10K 59/121*  (2023.01)
*H10K 59/12*  (2023.01)

(52) U.S. Cl.
CPC ......... *H10K 59/131* (2023.02); *H10K 59/121* (2023.02); *H10K 59/1201* (2023.02)

(58) Field of Classification Search
CPC ........................... H10K 59/131; H10K 59/121
See application file for complete search history.

(56) References Cited

U.S. PATENT DOCUMENTS 9,893,128 B2 * 2/2018 Choi .................... H10K 59/38
2009/0309489 A1 * 12/2009 Takata ................. H10K 59/131
313/504

(Continued)

FOREIGN PATENT DOCUMENTS

| CN | 109509771 | 3/2019 |
|---|---|---|
| CN | 110061032 | 7/2019 |

(Continued)

OTHER PUBLICATIONS

International Search Report and the Written Opinion Dated Apr. 26, 2022 From the International Searching Authority Re. Application No. PCT/CN2021/112130 and Its Translation Into English (13 Pages).

(Continued)

*Primary Examiner* — Michael Jung

(57) ABSTRACT

The present application discloses a display panel and an electronic device. The display panel includes a display area and a redundant pixel area located on at least one side of the display area. The display panel includes a substrate, a power supply wire, a light-emitting function layer, and a cathode disposed in sequence. At least a part of the power supply wire is located in the redundant pixel area; the light-emitting function layer covers the display area and the redundant pixel area; and the cathode is electrically connected to the power supply wire.

16 Claims, 8 Drawing Sheets

(56) References Cited

U.S. PATENT DOCUMENTS

2016/0372535 A1    12/2016  Lee et al.
2017/0288167 A1*   10/2017  Hanari ............... H10K 50/8423
2020/0027942 A1     1/2020  Kodama et al.

FOREIGN PATENT DOCUMENTS

| CN | 210349841 | 4/2020 |
| CN | 112420790 | 2/2021 |
| CN | 113097416 | 7/2021 |
| CN | 113471257 | 10/2021 |
| WO | WO 2019/187101 | 10/2019 |

OTHER PUBLICATIONS

Notification of Office Action and Search Report Dated Jan. 31, 2024 From the State Intellectual Property Office of the People's Republic of China Re. Application No. 202110891220.8 and Its Translation Into English. (19 Pages).

* cited by examiner

DISPLAY PANEL AND ELECTRONIC DEVICE HAVING POWER SUPPLY WIRE IN REDUNDANT PIXEL AREA ELECTRICALLY CONNECTED TO LIGHT-EMITTING FUNCTION LAYER

RELATED APPLICATIONS

This application is a National Phase of PCT Patent Application No. PCT/CN2021/112130 having International filing date of Aug. 11, 2021, which claims the benefit of priority of Chinese Patent Application No. 202110891220.8 filed on Aug. 4, 2021. The contents of the above applications are all incorporated by reference as if fully set forth herein in their entirety.

FILED AND BACKGROUND OF THE INVENTION

The present disclosure relates to the field of display technology, in particular to a display panel and an electronic device.

Organic light-emitting diodes (OLEDs) have characteristics of self-luminescence, high brightness, wide viewing angles, high contrast, flexibility, and low energy consumption. Therefore, the OLEDs have received extensive attention. As a new generation of display methods, the OLEDs gradually replace traditional liquid crystal displays (LCDs) and are widely used in display products such as mobile phone screens, computer monitors, and full-color TVs.

In an OLED display panel, if an OLED device structure comprises evaporated and patterned film layers, especially evaporated film layers using conventional masks, there will generally be a certain width of a non-film formation guarantee area. In addition, in order to ensure good uniformity of a light-emitting device, the non-film formation guarantee area must be designed outside a display area, so that a surface cathode formed after the evaporated film layers needs to be provided with a cathode overlap area outside the evaporated film layers. That is to say, the non-film formation guarantee area actually occupies a certain frame space. Therefore, how to reduce a width of a non-display area to realize a narrow frame design of the display panel is an urgent problem to be solved.

SUMMARY OF THE INVENTION

The embodiments of the present disclosure provide a display panel and an electronic device to solve a technical problem in the prior art that a frame of a display panel cannot be reduced when a cathode overlap area is provided in a non-display area.

An embodiment of the present disclosure provides a display panel, wherein the display panel comprises a display area and a redundant pixel area located on at least one side of the display area, and the display panel comprises:
  a substrate;
  a power supply wire disposed on the substrate, wherein at least a part of the power supply wire is located in the redundant pixel area;
  a light-emitting function layer disposed on the power supply wire, wherein the light-emitting function layer covers the display area and the redundant pixel area; and
  a cathode disposed on the light-emitting function layer and electrically connected to the power supply wire.

Alternatively, in some embodiments of the present disclosure, the display panel further comprises redundant sub-pixels located in the redundant pixel area, and each of the redundant sub-pixels comprises a metal pattern, and the metal patterns of at least two adjacent redundant sub-pixels are connected to form the power supply wire.

Alternatively, in some embodiments of the present disclosure, the display panel further comprises a source-drain metal layer located between the substrate and the light-emitting function layer, and the metal patterns are located in the source-drain metal layer.

Alternatively, in some embodiments of the present disclosure, the source-drain metal layer comprises redundant source electrodes and redundant drain electrodes, and the redundant sub-pixels comprise the redundant source electrodes and the redundant drain electrodes, the redundant source electrode of one of the redundant sub-pixels and the redundant source electrodes of adjacent redundant sub-pixels are connected to form the metal pattern; and/or
  the redundant drain electrode of one of the redundant sub-pixels and the redundant drains of the adjacent redundant sub-pixels are connected to form the metal pattern.

Alternatively, in some embodiments of the present disclosure, the display panel comprises at least one trench located in the redundant pixel area, and the trench exposes the power supply wire; and
  wherein an undercut structure is provided at a bottom of the trench, the light-emitting function layer and the cathode are disconnected at the undercut structure, and a part of the cathode covers a sidewall of the trench and is connected to the power supply wire.

Alternatively, in some embodiments of the present disclosure, the display panel comprises an insulating layer and a conductive layer sequentially disposed on the power supply wire, and the conductive layer is located on a side of the light-emitting function layer away from the cathode, wherein the conductive layer comprises a protruding portion extending into the trench and suspended relative to the insulating layer, and the protruding portion, a sidewall of the insulating layer, and a surface of the power supply wire define and form the undercut structure.

Alternatively, in some embodiments of the present disclosure, the display panel comprises a passivation layer, a planarization layer, the conductive layer, and a pixel defining layer sequentially disposed on the power supply wire, and the pixel defining layer is located on the side of the light-emitting function layer away from the cathode, and the trench penetrates the cathode, the light-emitting function layer, the pixel defining layer, the conductive layer, the planarization layer, and the passivation layer; and
  wherein the protruding portion extends into the trench and is suspended relative to the passivation layer, and the protruding portion, a sidewall of the passivation layer, and the surface of the power supply wire define and form the undercut structure.

Alternatively, in some embodiments of the present disclosure, the display panel comprises a passivation layer, the conductive layer, a planarization layer, an anode, and a pixel defining layer sequentially disposed on the power supply wire, and the pixel defining layer is located on the side of the light-emitting function layer away from the cathode, and the trench penetrates the cathode, the light-emitting function layer, the pixel defining layer, the anode, the planarization layer, the conductive layer, and the passivation layer; and
  wherein the protruding portion extends into the trench and is suspended relative to the passivation layer, and the protruding portion, the sidewall of the passivation layer, and the surface of the power supply wire define and form the undercut structure.

Alternatively, in some embodiments of the present disclosure, the power supply wire is disposed in the redundant pixel area.

Alternatively, in some embodiments of the present disclosure, the display panel further comprises a peripheral area adjacent to the redundant pixel area, and the peripheral area is located on a side of the redundant pixel area away from the display area; and wherein the power supply wire comprises a first power supply wire and a second power supply wire, and the first power supply wire is located in the redundant pixel area, the second power supply wire is located in the peripheral area, and the second power supply wire is connected to the first power supply wire.

An embodiment of the present disclosure provides a display panel, wherein the display panel comprises a display area, a redundant pixel area, and a peripheral area, wherein the redundant pixel area is located on at least one side of the display area, the peripheral area is disposed adjacent to the redundant pixel area and located on a side of the redundant pixel area away from the display area, and the display panel comprises:

a substrate;
a power supply wire disposed on the substrate, wherein the power supply wire comprises a first power supply wire and a second power supply wire, and the first power supply wire is located in the redundant pixel area, the second power supply wire is located in the peripheral area, and the second power supply wire is connected to the first power supply wire;
a light-emitting function layer disposed on the first power supply wire, wherein the light-emitting function layer covers the display area and the redundant pixel area;
a cathode disposed on the light-emitting function layer and electrically connected to the first power supply wire; and
at least one trench disposed in the redundant pixel area, wherein the at least one trench exposes the first power supply wire.

An embodiment of the present disclosure provides an electronic device, wherein the electronic device comprises a display panel, and the display panel comprises a display area and a redundant pixel area located on at least one side of the display area, wherein the display panel comprises:

a substrate;
a power supply wire disposed on the substrate, wherein at least a part of the power supply wire is located in the redundant pixel area;
a light-emitting function layer disposed on the power supply wire, wherein the light-emitting function layer covers the display area and the redundant pixel area; and
a cathode disposed on the light-emitting function layer and electrically connected to the power supply wire.

Alternatively, in some embodiments of the present disclosure, the display panel further comprises redundant sub-pixels, the redundant sub-pixels are located in the redundant pixel area and each of the redundant sub-pixels comprises a metal pattern, and the metal patterns of at least two adjacent redundant sub-pixels are connected to form the power supply wire.

Alternatively, in some embodiments of the present disclosure, the display panel further comprises a source-drain metal layer located between the substrate and the light-emitting function layer, and the metal patterns are located in the source-drain metal layer.

Alternatively, in some embodiments of the present disclosure, the source-drain metal layer comprises redundant source electrodes and redundant drain electrodes, and the redundant sub-pixels comprise the redundant source electrodes and the redundant drain electrodes, the redundant source electrode of one of the redundant sub-pixels and the redundant source electrodes of adjacent redundant sub-pixels are connected to form the metal pattern; and/or the redundant drain electrode of one of the redundant sub-pixels and the redundant drains of adjacent redundant sub-pixels are connected to form the metal pattern.

Alternatively, in some embodiments of the present disclosure, the display panel comprises at least one trench located in the redundant pixel area, and the trench exposes the power supply wire; and wherein an undercut structure is provided at a bottom of the trench, the light-emitting function layer and the cathode are disconnected at the undercut structure, and a part of the cathode covers a sidewall of the trench and is connected to the power supply wire.

Alternatively, in some embodiments of the present disclosure, the display panel comprises an insulating layer and a conductive layer sequentially disposed on the power supply wire, and the conductive layer is located on a side of the light-emitting function layer away from the cathode, wherein the conductive layer comprises a protruding portion extending into the trench and suspended relative to the insulating layer, and the protruding portion, a sidewall of the insulating layer, and a surface of the power supply wire define and form the undercut structure.

Alternatively, in some embodiments of the present disclosure, the display panel comprises a passivation layer, a planarization layer, the conductive layer, and a pixel defining layer sequentially disposed on the power supply wire, and the pixel defining layer is located on the side of the light-emitting function layer away from the cathode, and the trench penetrates the cathode, the light-emitting function layer, the pixel defining layer, the conductive layer, the planarization layer, and the passivation layer; and wherein the protruding portion extends into the trench and is suspended relative to the passivation layer, and the protruding portion, a sidewall of the passivation layer, and the surface of the power supply wire define and form the undercut structure.

Alternatively, in some embodiments of the present disclosure, the power supply wire is disposed in the redundant pixel area.

Alternatively, in some embodiments of the present disclosure, the display panel further comprises a peripheral area adjacent to the redundant pixel area, and the peripheral area is located on a side of the redundant pixel area away from the display area; and wherein the power supply wire comprises a first power supply wire and a second power supply wire, the first power supply wire is located in the redundant pixel area, the second power supply wire is located in the peripheral area, and the second power supply wire is connected to the first power supply wire.

Compared with the display panel in the prior art, the display panel provided by the present disclosure comprises the substrate, the power supply wire, the light-emitting function layer, and the cathode disposed in sequence. At least a part of the power supply wire is located in the redundant pixel area, and the cathode is electrically connected to the power supply wire. In the present disclosure, by setting at least a part of the power supply wire in the redundant pixel area, a space of the redundant pixel area is utilized, and in a layout design of the display panel, a width of the power supply wire in a non-display area outside the redundant pixel area can be reduced, which is conducive to realization of a narrow frame design of the display panel.

BRIEF DESCRIPTION OF THE SEVERAL VIEWS OF THE DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DESCRIPTION OF SPECIFIC EMBODIMENTS OF THE INVENTION

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

Embodiments of the present disclosure provides a display panel and an electronic device. Detailed descriptions are given below. It should be noted that a description order of the following embodiments is not intended to limit a preferred order of the embodiments.

The present disclosure provides a display panel comprising a display area and a redundant pixel area located on at least one side of the display area. The display panel comprises a substrate, a power supply wire, a light-emitting function layer, and a cathode disposed in sequence. At least a part of the power supply wire is located in the redundant pixel area. The light-emitting function layer covers the display area and the redundant pixel area. The cathode is electrically connected to the power supply wire.

Therefore, the present disclosure utilizes a space of the redundant pixel area by arranging at least a part of the power supply wire in the redundant pixel area, and furthermore, in a layout design of the display panel, a width of the power supply wire in a non-display area outside the redundant pixel area can be reduced, thereby facilitating the realization of a narrow frame design of the display panel.

The display panel provided by the present disclosure will be described in detail below through specific embodiments.

Figure 1:
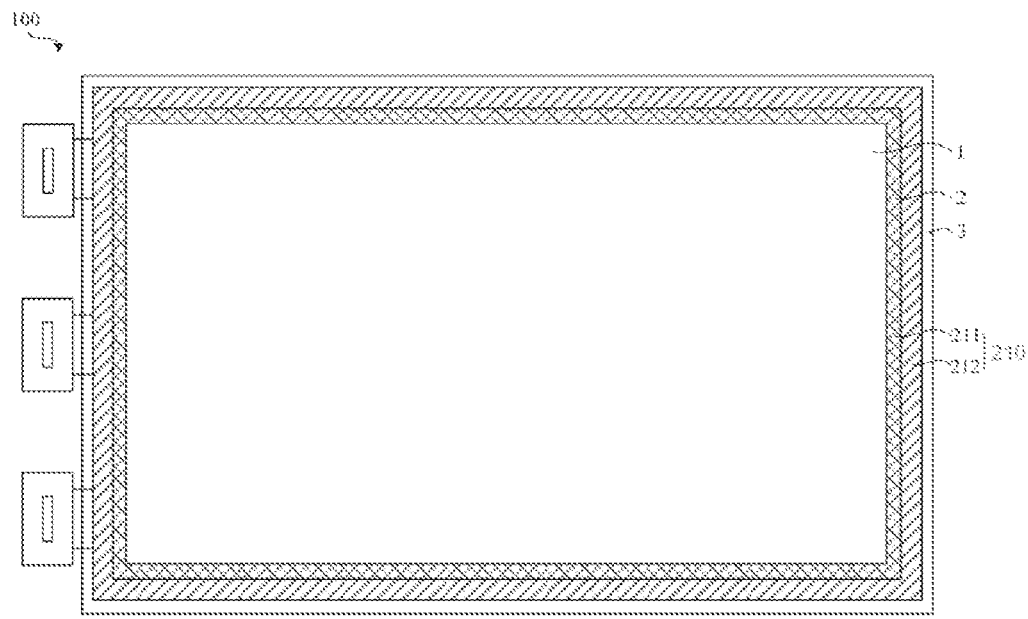
FIG. 1 is a schematic diagram of a planar structure of a display panel provided by a first embodiment of the present disclosure.
Figure 2:
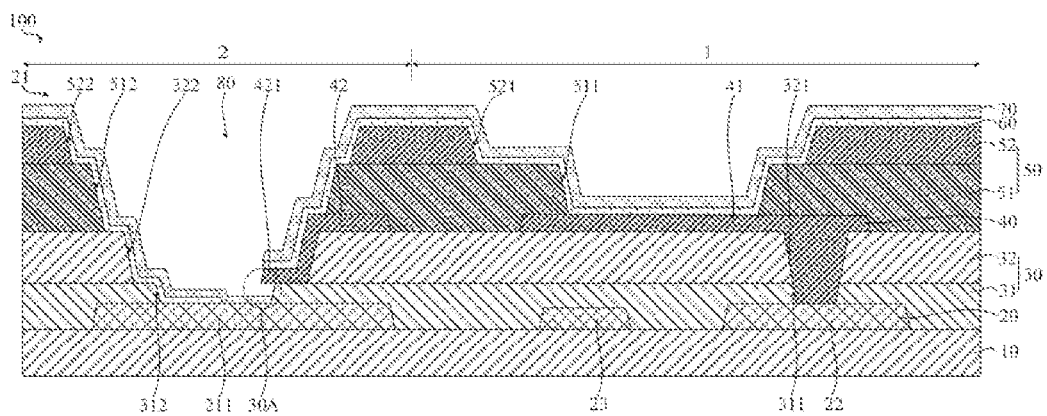
FIG. 2 is a schematic diagram of a cross-sectional structure of the display panel provided by the first embodiment of the present disclosure.
Figure 3:
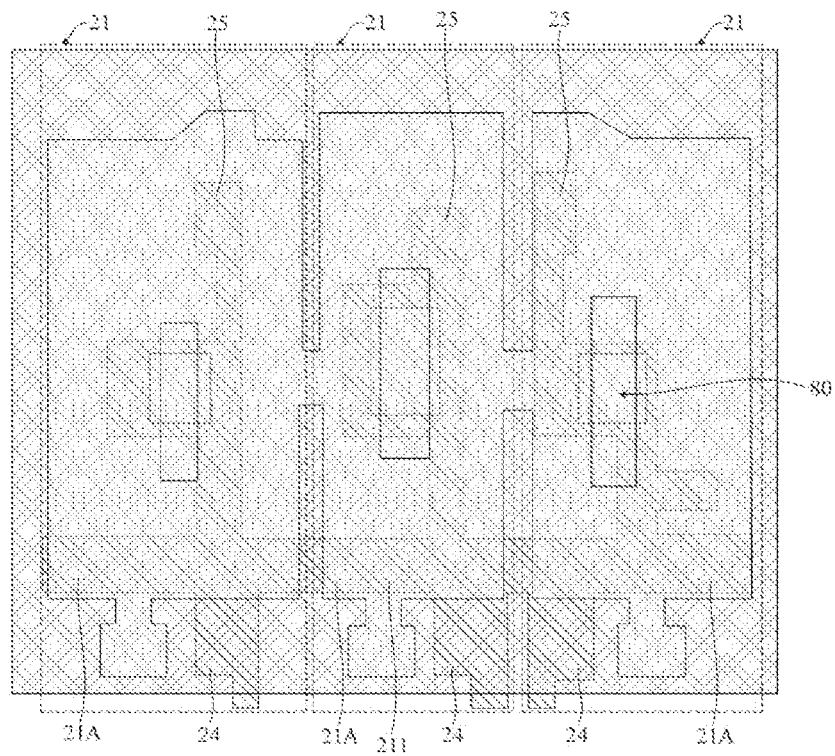
FIG. 3 is a schematic diagram of a planar structure of a redundant pixel area in the display panel provided by the first embodiment of the present disclosure.

Referring to FIGS. 1 to 3, a first embodiment of the present disclosure provides a display panel 100. The display panel 100 comprises a display area 1 and a redundant pixel area 2 located on at least one side of the display area 1. The display panel 100 comprises a substrate 10, a power supply wire 210, a light-emitting function layer 60, and a cathode 70 disposed in sequence. At least a part of the power supply wire 210 is located in the redundant pixel area 2. The light-emitting function layer 60 covers the display area 1 and the redundant pixel area 2. The cathode 70 is electrically connected to the power supply wire 210.

As shown in FIG. 1, the redundant pixel area 2 is disposed around the display area 1. In this embodiment, the display panel 100 further comprises a peripheral area 3. The peripheral area 3 is disposed adjacent to the redundant pixel area 2. The peripheral area 3 is located on a side of the redundant pixel area 2 away from the display area 1.

It should be noted that, in some embodiments, the redundant pixel area 2 can also be disposed on two or three sides of the display area 1, and a position of the redundant pixel area 2 can be set according to actual application requirements of the display panel 100, which is not limited in the present disclosure.

Wherein, the power supply wire 210 is configured to input power signals to the cathode 70, and the power supply wire 210 may be a VSS signal wire. In this embodiment, the power supply wire 210 comprises a first power supply wire 211 and a second power supply wire 212. The first power supply wire 211 is located in the redundant pixel area 2. The second power supply wire 212 is located in the peripheral area 3. The second power supply wire 212 is connected to the first power supply wire 211.

It is understandable that, in the prior art, in order to reduce a voltage drop of a VSS signal line in the display area, a certain width of the VSS signal line is usually disposed in the peripheral area. The inventor of the present disclosure has discovered through experimental investigation that in order to decrease uneven brightness of the display panel caused by the voltage drop of the VSS signal line in the display area, sufficient space needs to be reserved in the peripheral area to meet width design requirements of the VSS signal line. However, when the width of the VSS signal wire in the peripheral area is large, it occupies a large amount of space in the peripheral area, which is not conducive to the narrow frame design of the display panel.

In view of the above technical problem, in this embodiment, the power supply wire 210 is designed to comprise the first power supply wire 211 and the second power supply wire 212. Since the first power supply wire 211 is located in the redundant pixel area 2, a part of the power supply wire 210 is formed using the redundant pixel area 2, and when a total width of the power supply wire 210 is constant, a width of the second power supply wire 212 in the peripheral area 3 can be reduced, thereby saving space in the peripheral area 3 and beneficial to realize the narrow frame design of the display panel 100.

With reference to FIGS. 2 and 3, the display panel 100 comprises a source-drain metal layer 20, an insulating layer 30, a conductive layer 40, and a pixel defining layer 50 that are sequentially disposed on the substrate 10. The pixel defining layer 50 is located on a side of the light-emitting function layer 60 away from the cathode 70.

Wherein, the source-drain metal layer 20 comprises a source electrode 22, a drain electrode 23, a redundant source electrode 24, and a redundant drain electrode 25. The source electrode 22 and the drain electrode 23 are located in the display area 1. The redundant source electrode 24 and the redundant drain electrode 25 are located in the redundant pixel area 2. Wherein, the redundant source electrode 24 is not electrically connected to a data line (not shown in the figures) in the display panel 100, and the redundant drain electrode 25 is not electrically connected to an anode 41 in the display panel 100.

The insulating layer 30 comprises a passivation layer 31 and a planarization layer 32 sequentially disposed on the source-drain metal layer 20. The planarization layer 32 is located on a side of the conductive layer 40 close to the substrate 10. The passivation layer 31 is provided with a first opening 311 and a second opening 312. The first opening 311 is located in the display area 1 and exposes the source electrode 22. The second opening 312 is located in the redundant pixel area 2 and exposes the first power supply wire 211. The planarization layer 32 is provided with a third opening 321 and a fourth opening 322. The third opening 321 is located in the display area 1 and is connected with the first opening 311. The fourth opening 322 is located in the redundant pixel area 2 and is connected with the second opening 312.

The conductive layer 40 is an anode layer. The conductive layer 40 comprises the anode 41 and a conductive portion 42 sequentially disposed on the planarization layer 32. The anode 41 is located in the display area 1. The anode 41 is electrically connected to the source 22 through the third opening 321 and the first opening 311 in sequence. The conductive portion 42 is located in the redundant pixel area 2. The conductive portion 42 extends from a top of the fourth opening 322 to a surface of the passivation layer 31 away from the substrate 10. A part of the conductive portion 42 that exceeds the passivation layer 31 is a protruding portion 421.

The pixel defining layer 50 comprises a first pixel defining layer 51 and a second pixel defining layer 52 disposed in sequence. Wherein, the first pixel defining layer 51 is provided with a first opening 511 and a second opening 512. The first opening 511 is located in the display area 1 and exposes the anode 41. The second opening 512 is located in the redundant pixel area 2 and is connected with the fourth opening 322. The second pixel defining layer 52 is provided with a third opening 521 and a fourth opening 522. The third opening 521 is located in the display area 1 and is connected with the first opening 511. The fourth opening 522 is located in the redundant pixel area 2 and is connected with the second opening 512.

It should be noted that, in this embodiment, the display panel 100 further comprises film structures such as a buffer layer, an active layer, a gate insulating layer, a gate metal layer, and a dielectric insulating layer which are sequentially disposed between the substrate 10 and the source-drain metal layer 20. The foregoing film structures can refer to the prior art, which will not be repeated here.

In this embodiment, the second opening 312, the fourth opening 322, the second opening 512, and the fourth opening 522 are connected to form a trench 80. That is to say, the trench 80 penetrates the cathode 70, the light-emitting function layer 60, the pixel defining layer 50, the conductive layer 40, the planarization layer 32, and the passivation layer 31. The trench 80 is located in the redundant pixel area 2. The trench 80 exposes the first power supply wire 211. A bottom of the trench 80 is provided with an undercut structure 30A. The protruding portion 421 extends into the trench 80 and is suspended relative to the passivation layer 31. The protruding portion 421, a sidewall of the second opening 312, and a surface of the first power supply wire 211 define the undercut structure 30A. Wherein, the light-emitting function layer 60 and the cathode 70 are disconnected at the undercut structure 30A. A part of the cathode 70 covers a sidewall of the trench 80 and is connected with the first power supply wire 211.

In the redundant pixel area 2, the display panel 100 comprises redundant sub-pixels 21. As shown in FIG. 3, each of the redundant sub-pixels 21 has a metal pattern 21A. The metal patterns 21A of at least two adjacent redundant sub-pixels 21 are connected to form the first power supply wire 211.

It should be noted that, this embodiment only illustrates a structure when the metal patterns 21A of three adjacent redundant sub-pixels 21 are connected to form the first power supply wire 211, but it is not limited to this. Wherein, a number of the metal patterns 21A connected to form the first power supply wire 211 can be set according to design of the redundant sub-pixels 21 in the display panel 100. In order to minimize a space of the peripheral area 3 in the display panel 100, a space of the redundant pixel area 2 can be fully utilized, that is to say, the metal patterns 21A of all the redundant sub-pixels 21 in the redundant pixel area 2 are connected to form the first power supply wire 211, thereby minimizing a frame of the display panel 100.

In this embodiment, the metal patterns 21A are located in the source-drain metal layer 20. Each of the redundant sub-pixels 21 comprises the redundant source electrode 24 and the redundant drain electrode 25. The redundant source electrode 24 and the redundant drain electrode 25 of each redundant sub-pixel 21 are connected, and the redundant source electrodes 24 of adjacent redundant sub-pixels 21 are connected to form the metal pattern 21A. Since the source-drain metal layer 20 is an original film layer of the display panel 100, by using the metal patterns 21A in the source-drain metal layer 20 to form the first power supply wire 211, the narrow frame design can be realized without increasing a panel manufacturing process.

In some embodiments, only the redundant source electrodes 24 of different redundant sub-pixels 21 may be connected to form the metal pattern 21A. That is to say, the redundant source electrode 24 of one redundant sub-pixel 21 and the redundant source electrodes 24 of the adjacent redundant sub-pixels 21 are connected to form the metal pattern 21A. Alternatively, only the redundant drain electrodes 25 of different redundant sub-pixels 21 may be connected to form the metal pattern 21A. That is to say, the redundant drain electrode 25 of one redundant sub-pixel 21 and the redundant drain electrodes 25 of the adjacent redundant sub-pixels 21 are connected to form the metal pattern 21A, which will not be repeated here.

It should be noted that in the redundant pixel area 2, all the metal patterns 21A patterned and formed by the source-drain metal layer 20 may be connected to form the first power supply wire 211. The greater a cross-sectional area of the first power supply wire 211, the better an improvement effect on the voltage drop of the VSS signal line (not shown in the figures) in the display area 1, the more uniform the brightness of the display panel 100, and the better the display effect. Wherein, a specific structure of the metal pattern 21A can also be set according to the structural design of the redundant pixel area 2 in the display panel 100. For example, the metal patterns 21A can also be formed by connection of patterns such as data lines and capacitor structures, as long as it is ensured that the first power supply wire 211 is formed by the metal patterns 21A of the redundant pixel area 2, which are all within the protection scope of the present disclosure.

In addition, in some embodiments, when the display panel 100 is provided with a light-shielding metal layer (not shown in the figures) under thin film transistors (not shown in the figures), the first power supply wire 211 can also be formed by metal patterns of the light-shielding metal layer in the redundant pixel area 2, which will not be repeated here.

In this embodiment, the second power supply wire 212 is located in the source-drain metal layer 20. The second power supply wire 212 overlaps the cathode 70 in the peripheral area 3 to reduce the voltage drop of the VSS signal line in the display area 1. Wherein, a specific overlap structure of the second power supply wire 212 and the cathode 70 can refer to the prior art, which will not be repeated here.

It should be noted that, in this embodiment, the display panel 100 further comprises an encapsulation layer (not shown in the figures) disposed on a side of the cathode 70 away from the light-emitting function layer 60. A specific structure of the encapsulation layer can refer to the prior art, which will not be repeated here.

Since the metal patterns 21A of the redundant pixel area 2 are not electrically connected to the signal lines such as data lines, scan lines, etc. in the display panel 100, the display panel 100 provided in this embodiment uses the metal patterns 21A of the redundant pixel area 2 as a part of the power supply wire 210, and uses the space of the redundant pixel area 2 to form the first power supply wire 211, and when the width of the power supply wire 210 is constant, the width of the second power supply wire 212 located in the peripheral area 3 can be reduced. Therefore, the space of the peripheral area 3 can be greatly saved to meet the design requirements of the narrow frame of the display panel 100.

Referring to FIGS. 4A to 4I, an embodiment of the present disclosure also provides a manufacturing method of the display panel 100 as described in the foregoing first embodiment, which comprises following steps:

B11: providing the substrate 10, and forming the first power supply wire 211, the passivation layer 31, and the planarization layer 32 sequentially on the substrate 10.

Figure 4A:
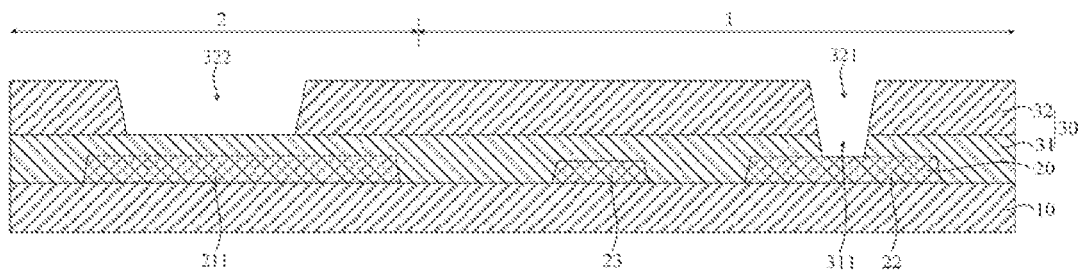
FIGS. 4A, 4B, 4C, 4D, 4E, 4F, 4G, 4H and 4I are schematic diagrams of structures obtained sequentially at each stage in a manufacturing method of the display panel provided by the first embodiment of the present disclosure.

Please refer to FIG. 4A, step B11 specifically comprises following steps:

B111: providing the substrate 10, and sequentially forming the buffer layer, the active layer, the gate insulating layer, the gate metal layer, and the dielectric insulating layer (not shown in the figures) on the substrate 10. Wherein, the specific structure and manufacturing process of the above-mentioned film layers can be referred to the prior art, which will not be repeated here.

B112: forming the source-drain metal layer 20 on the substrate 10, and patterning the source-drain metal layer 20 to form the source electrode 22, the drain electrode 23, and the first power supply wire 211.

B113: forming the passivation layer 31 on the source-drain metal layer 20, and patterning the passivation layer 31 to form the first opening 311 in the passivation layer 31.

B114: forming the planarization layer 32 on the passivation layer 31, and patterning the planarization layer 32 to form the third opening 321 and the fourth opening 322 in the planarization layer 32. Wherein, the third opening 321 is connected to the first opening 311.

Figure 4B:
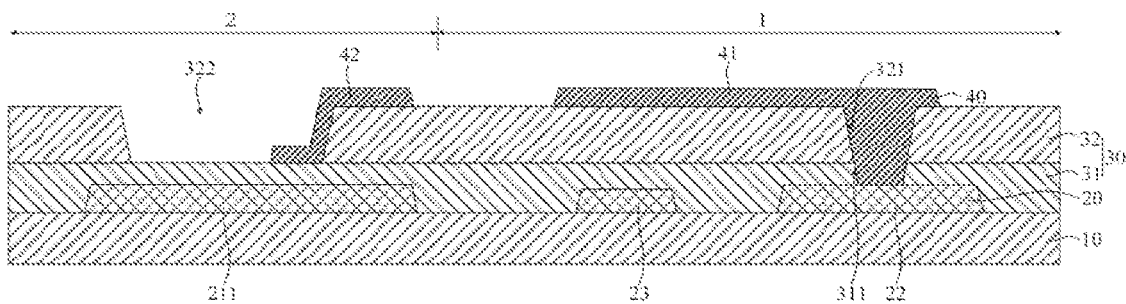

B12: forming the anode 41 and the conductive portion 42 on the planarization layer 32, as shown in FIG. 4B.

First, the conductive layer 40 is formed on the planarization layer 32; and then, the conductive layer 40 is patterned to form the anode 41 and the conductive portion 42.

Figure 4C:
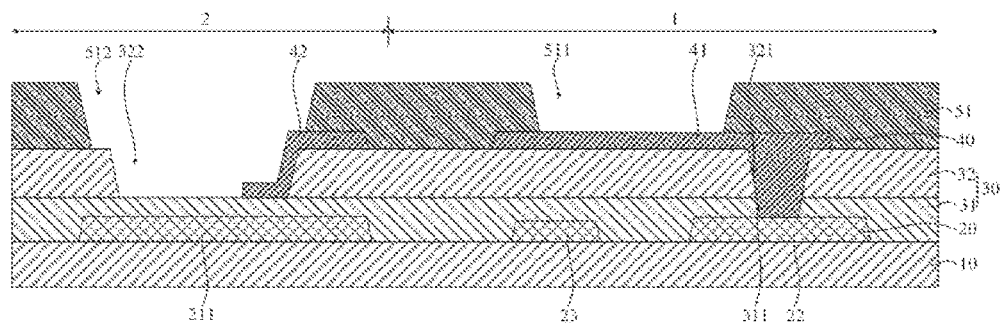

B13: forming the first pixel defining layer 51 on the conductive layer 40 and patterning the first pixel defining layer 51 to form the first opening 511 and the second opening 512, as shown in FIG. 4C.

Figure 4D:
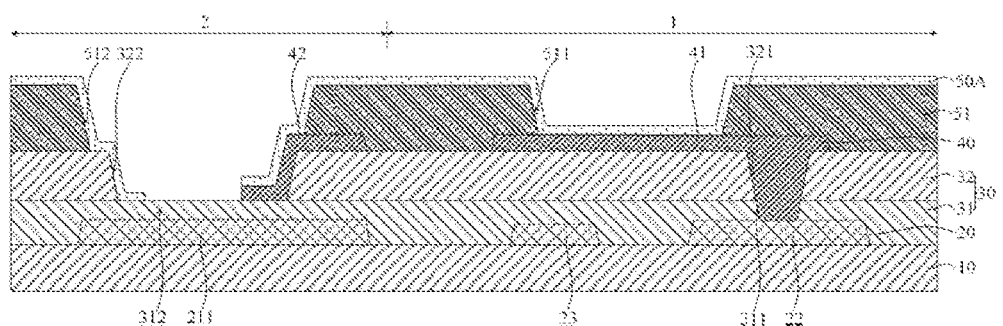

B14: forming a photoresist layer 50A on the first pixel defining layer 51. Wherein, the photoresist layer 50A covers the conductive portion 42 and exposes the surface of the passivation layer 31, as shown in FIG. 4D.

Figure 4E:
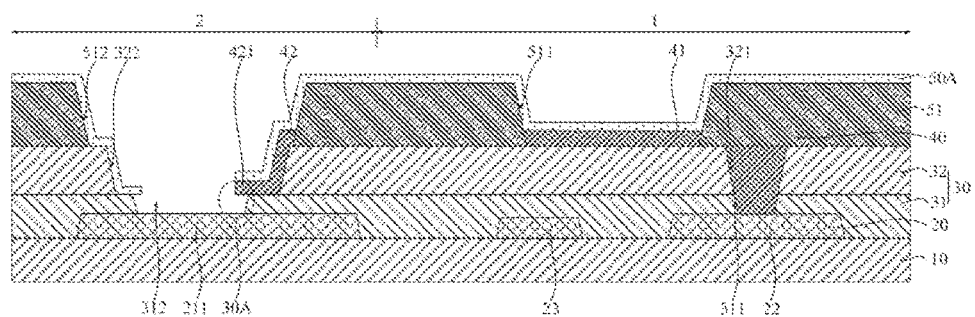

B15: in the redundant pixel area 2, etching a part of the passivation layer 31 not covered by the photoresist layer 50A to form the undercut structure 30A, as shown in FIG. 4E.

Specifically, a wet etching process can be used to etch the part of the passivation layer 31 that is not covered by the photoresist layer 50A, and over-etching is ensured, so that the second opening 312 is formed in the passivation layer 31, and the conductive portion 42 protrudes with respect to the passivation layer 31, and the part of the conductive portion 42 that exceeds the passivation layer 31 forms the protruding portion 421. The protruding portion 421, the sidewall of the second opening 312, and the surface of the first power supply wire 211 define the undercut structure 30A.

Figure 4F:
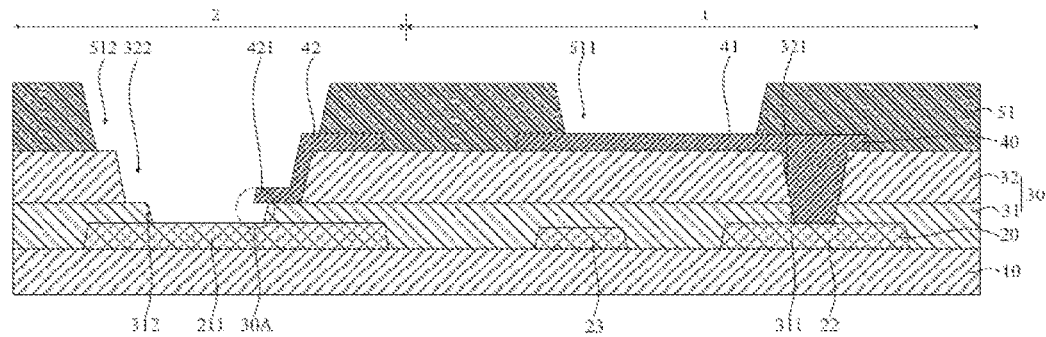

B16: peeling off the photoresist layer 50A, as shown in FIG. 4F.

Figure 4G:
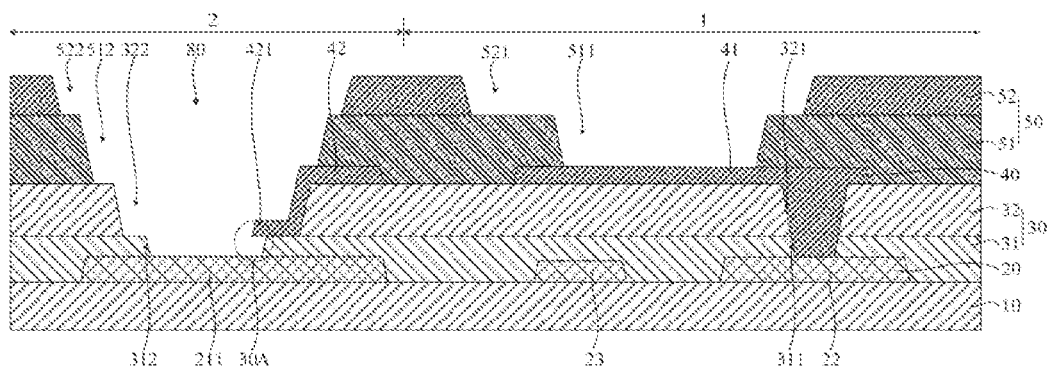

B17: forming the second pixel defining layer 52 on the first pixel defining layer 51, and forming the third opening 521 and the fourth opening 522 in the second pixel defining layer 52, wherein the second opening 312, the fourth opening 322, the second opening 512, and the fourth opening 522 are connected with each other to form the trench 80, as shown in FIG. 4G.

Figure 4H:
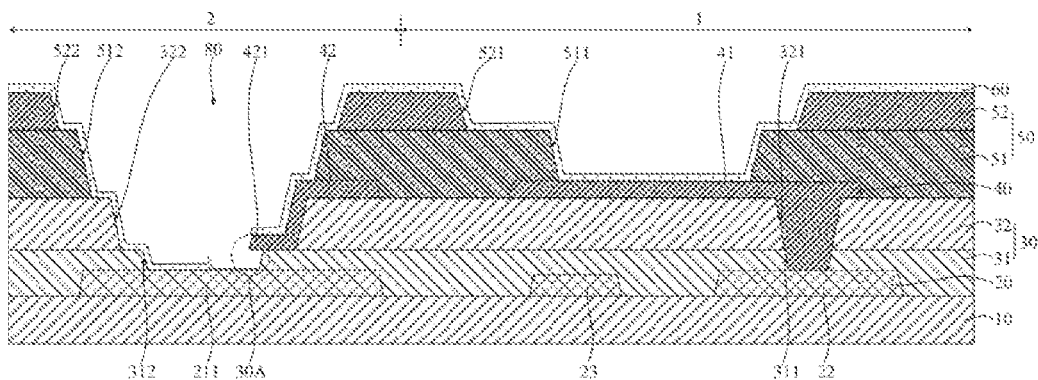

B18: forming the light-emitting function layer 60 on the second pixel defining layer 52, as shown in FIG. 4H.

Wherein, the light-emitting function layer 60 can be formed by an evaporation process. During the evaporation process, by adjusting an evaporation angle of the light-emitting material, a coverage area of the light-emitting function layer 60 on a surface of the first power supply wire 211 can be reduced.

Figure 4I:
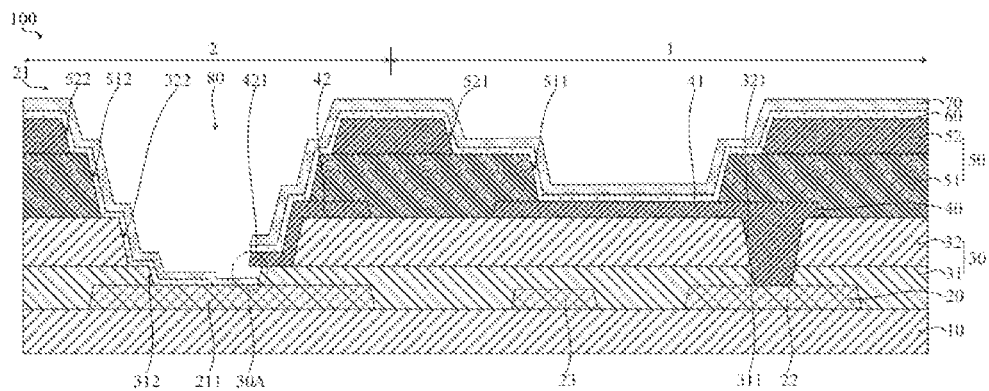

B19: forming the cathode 70 on the light-emitting function layer 60 to form the display panel 100, as shown in FIG. 4I.

Specifically, the cathode 70 is formed by the evaporation process. During the evaporation process, by adjusting the evaporation angle of the cathode 70 material, the coverage area of the cathode 70 on the first power supply wire 211 can be increased, thereby increasing the overlap area between the cathode 70 and the first power supply wire 211, thereby decreasing a resistance of the first power supply wire 211.

Figure 5:
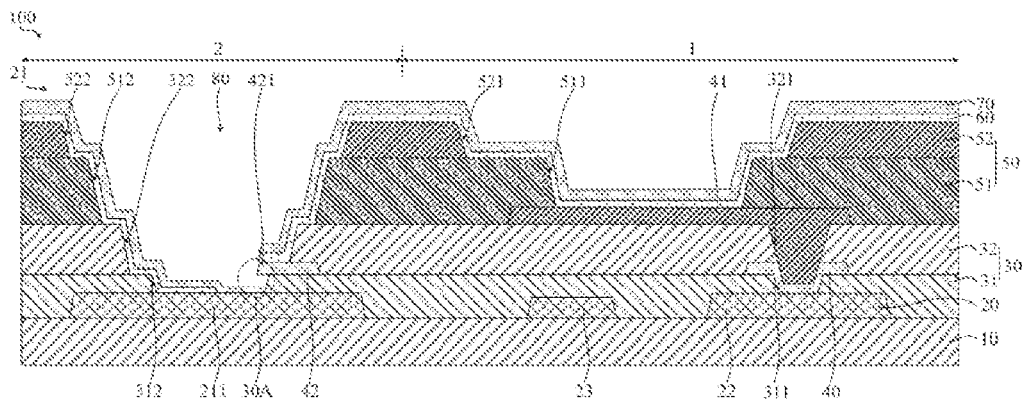
FIG. 5 is a schematic diagram of a cross-sectional structure of a display panel provided by a second embodiment of the present disclosure.

Referring to FIG. 5, a second embodiment of the present disclosure further provides a display panel 100. A difference between the display panel 100 provided in the second embodiment of the present disclosure and that of the first embodiment is that: the conductive layer 40 is located between the passivation layer 31 and the planarization layers 32. The trench 80 penetrates the cathode 70, the light-emitting function layer 60, the pixel defining layer 50, the anode 41, the planarization layer 32, the conductive layer 40, and the passivation layer 31. Wherein, the conductive layer 40 may be a metal layer.

Referring to FIGS. 6A to 6J, an embodiment of the present disclosure also provides a manufacturing method of the display panel 100 as described in the foregoing second embodiment, which comprises following steps:

B21: providing the substrate 10, and forming the first power supply wire 211, the passivation layer 31, and the conductive layer 40 sequentially on the substrate 10.

Figure 6A:
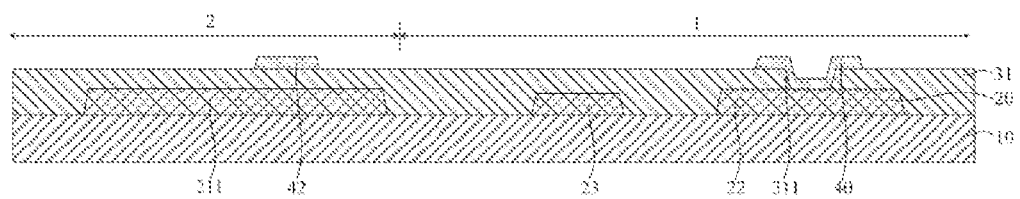
FIGS. 6A, 6B, 6C, 6D, 6E, 6F, 6G, 6H, 6I and 6J are schematic diagrams of structures obtained sequentially at each stage in a manufacturing method of the display panel provided by the second embodiment of the present disclosure.

Referring to FIG. 6A, the step B21 specifically comprises following steps:

B211: providing the substrate 10, and sequentially forming the buffer layer, the active layer, the gate insulating layer, the gate metal layer, and the dielectric insulating layer (not shown in the figures) on the substrate 10. Wherein, the specific structure and manufacturing process of the above-mentioned film layers can be referred to the prior art, which will not be repeated here.

B212: forming the passivation layer 31 on the source-drain metal layer 20 and patterning the passivation layer 31 to form the first opening 311 on the passivation layer 31.

B213: forming the conductive layer 40 on the passivation layer 31, and patterning the conductive layer 40 to form the conductive portion 42 in the redundant pixel region 2.

Figure 6B:
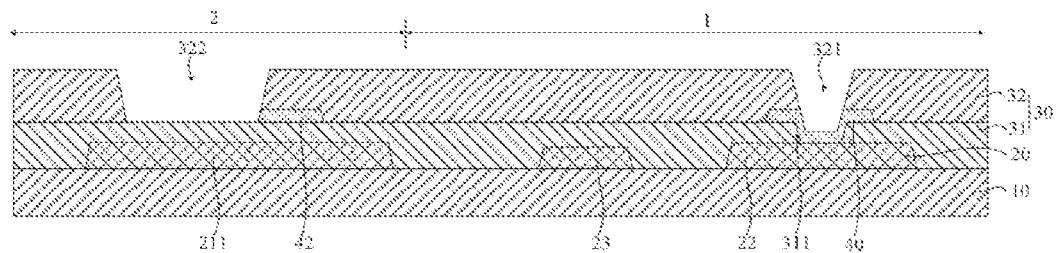

B22: forming the planarization layer 32 on the conductive layer and patterning the planarization layer 32 to form the third opening 321 and the fourth opening 322 in the planarization layer 32, wherein the fourth opening 322 is located in the redundant pixel area 2 and exposes the side surface of the conductive portion 42, as shown in FIG. 6B.

Figure 6C:
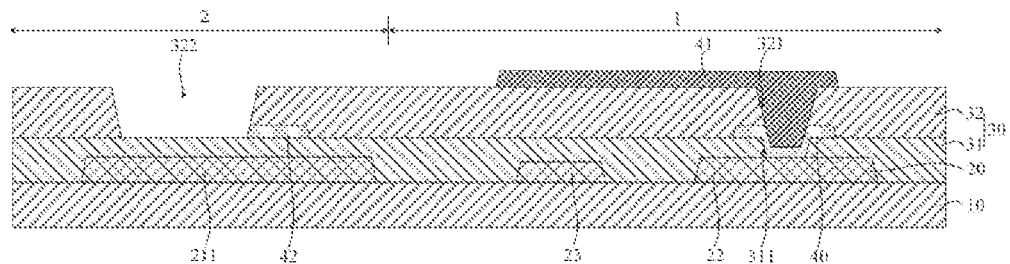

B23: forming the anode 41 on the planarization layer 32, wherein the anode 41 is electrically connected to the source electrode 22 through the conductive layer 40, as shown in FIG. 6C.

Figure 6D:
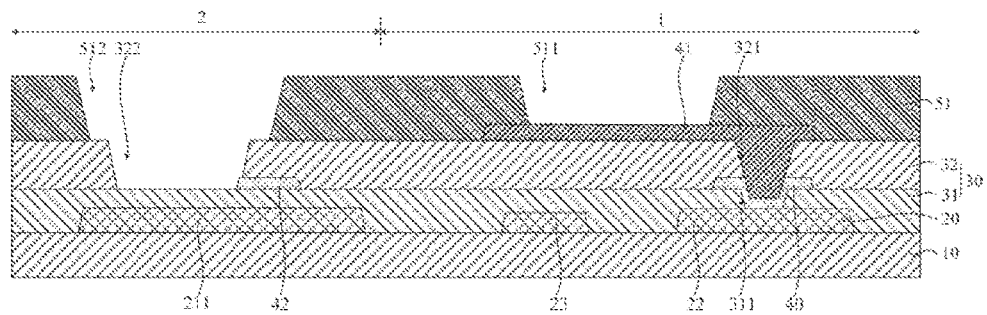

B24: forming the first pixel defining layer 51 on the anode 41, and patterning the first pixel defining layer 51 to form the first opening 511 and the second opening 512, as shown in FIG. 6D.

Figure 6E:
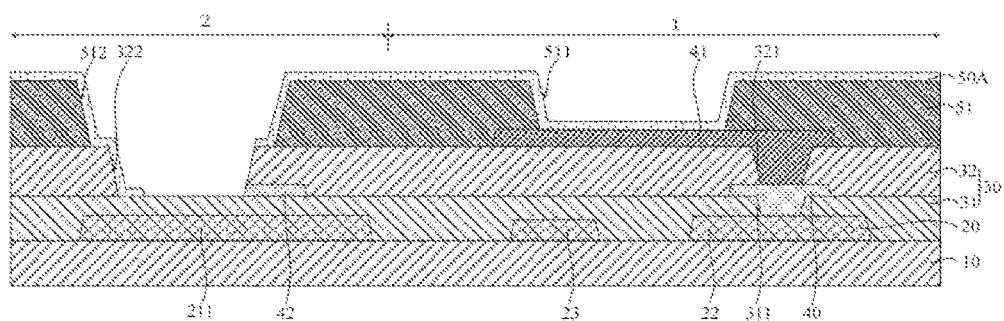

B25: forming the photoresist layer 50A on the first pixel defining layer 51, wherein the photoresist layer 50A covers the conductive portion 42 and exposes the surface of the passivation layer 31, as shown in FIG. 6E.

Figure 6F:
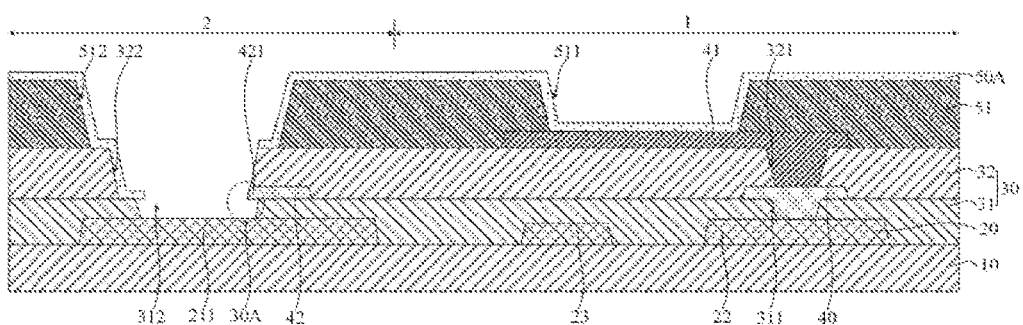

B26: in the redundant pixel area 2, etching the part of the passivation layer 31 that is not covered by the photoresist layer 50A to form the undercut structure 30A, as shown in FIG. 6F.

Figure 6G:
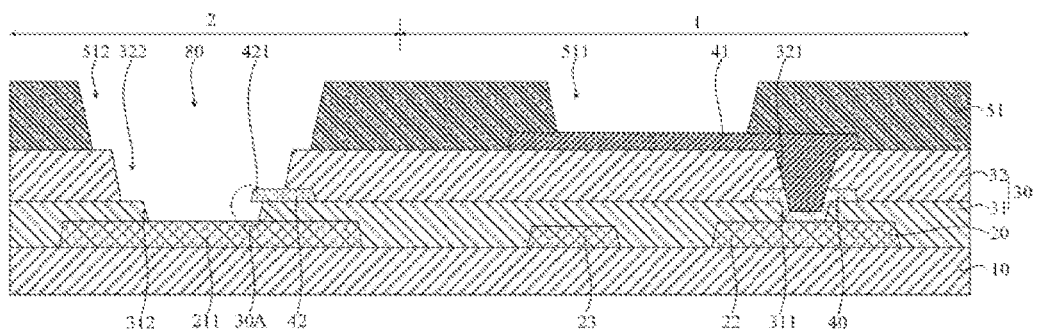

B27: peeling off the photoresist layer 50A, as shown in FIG. 6G.

Figure 6H:
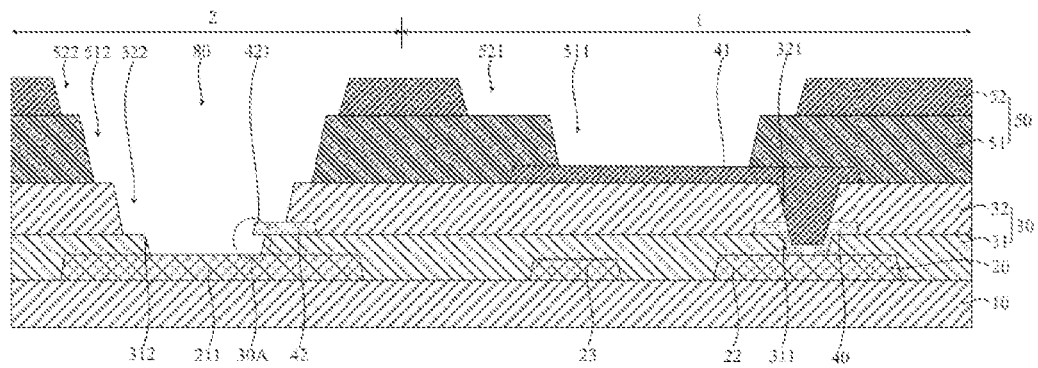

B28: forming the second pixel defining layer 52 on the first pixel defining layer 51, and forming the third opening 521 and the fourth opening 522 in the second pixel defining layer 52, wherein the second opening 312, the fourth opening 322, the second opening 512, and the fourth opening 522 are connected with each other to form the trench 80, as shown in FIG. 6H.

Figure 6I:
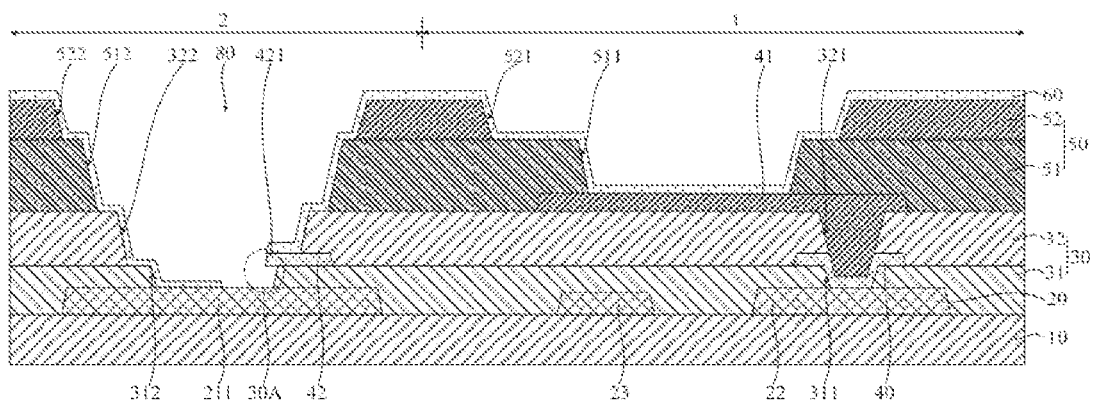

B29: forming the light-emitting function layer 60 on the second pixel defining layer 52, as shown in FIG. 6I.

Wherein, the light-emitting function layer 60 can be formed by the evaporation process. During the evaporation process, by adjusting the evaporation angle of the light-emitting material, the coverage area of the light-emitting function layer 60 on the surface of the first power supply wire 211 can be reduced.

Figure 6J:
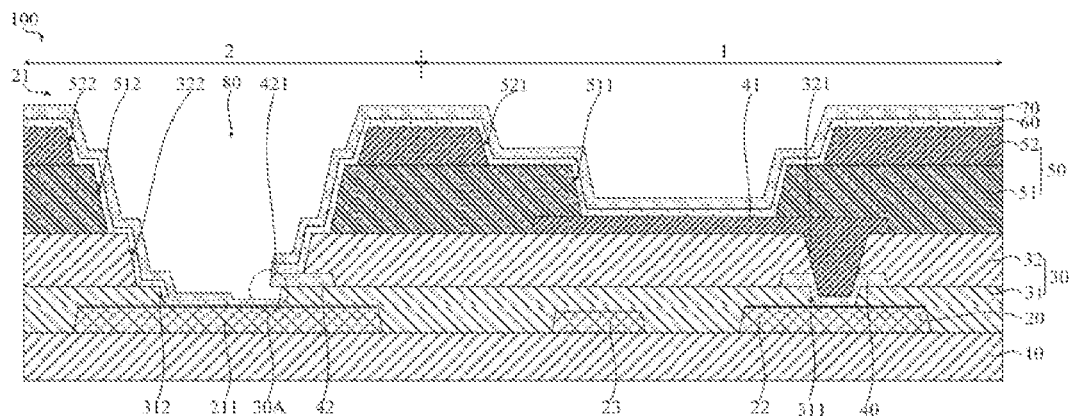

B30: forming the cathode 70 on the light-emitting function layer 60 to form the display panel 100, as shown in FIG. 6J.

Specifically, the cathode 70 is formed by the evaporation process. During the evaporation process, by adjusting the evaporation angle of the cathode 70 material, the coverage area of the cathode 70 on the first power supply wire 211 can be increased, thereby increasing the overlap area between the cathode 70 and the first power supply wire 211, thereby the resistance of the first power supply wire 211 can be reduced.

Figure 7:
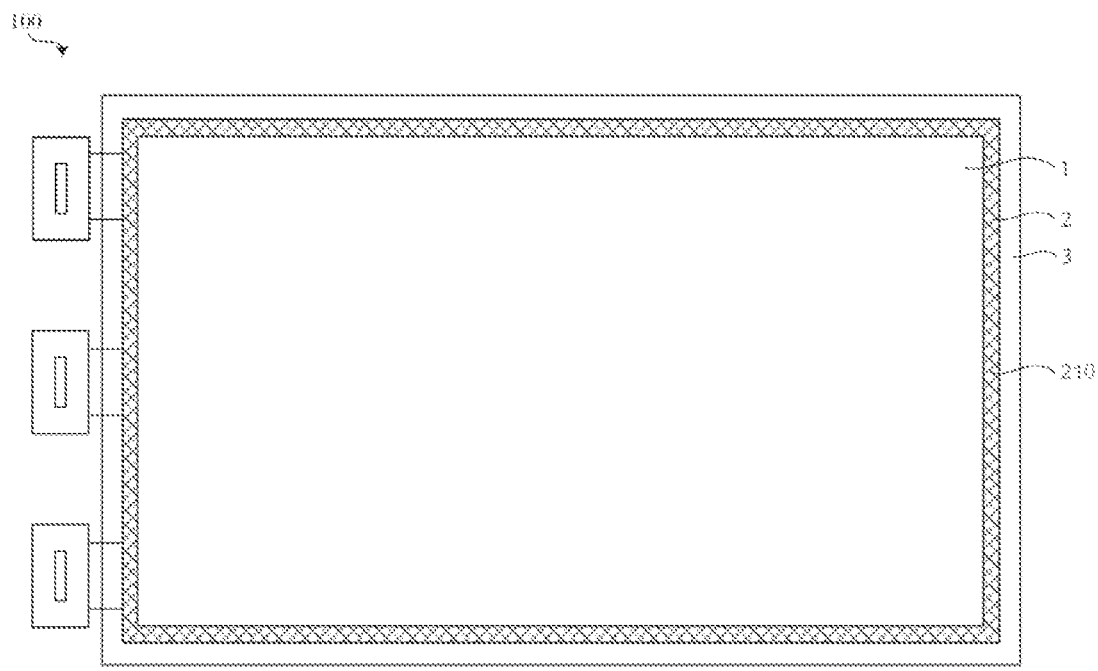
FIG. 7 is a schematic diagram of a planar structure of a display panel provided by a third embodiment of the present disclosure.

Referring to FIG. 7, a third embodiment of the present disclosure further provides a display panel 100. A difference between the display panel 100 provided in the third embodiment of the present disclosure and that of the first embodiment is that the power supply wire 210 is disposed in redundant pixel area 2.

In this embodiment, the power supply wire 210 is formed by using only the space of the redundant pixel area 2, the space occupied by the power supply wire 210 in the peripheral area 3 can be completely prevented, and the frame of the display panel can be further reduced.

Compared with the display panel in the prior art, the display panel provided by the present disclosure comprises the substrate, the power supply wire, the light-emitting function layer, and the cathode disposed in sequence. At least a part of the power supply wire is located in the redundant pixel area, and the cathode is electrically connected to the power supply wire. In the present disclosure, by setting at least a part of the power supply wire in the redundant pixel area, the space of the redundant pixel area is utilized, and in the layout design of the display panel, the width of the power supply wire in the non-display area outside the redundant pixel area can be reduced, which is conducive to the realization of the narrow frame design of the display panel.

An embodiment of the present disclosure also provides an electronic device, and the electronic device may be a display product such as a mobile phone, a tablet, a notebook computer, and a TV. Wherein, the electronic device comprises a display panel, and the display panel may be the display panel described in any of the foregoing embodiments. For the specific structure of the display panel, refer to the description of the foregoing embodiments, which will not be repeated here.

The display panel and the electronic device provided in the embodiments of the present disclosure are described in detail above. Specific examples are used in this article to illustrate the principles and implementation of the present disclosure. The descriptions of the above examples are only used to help understand the methods and core ideas of the present disclosure; at the same time, for those skilled in the art, according to the principles of the present disclosure, there will be changes in the specific implementation and application scope. In summary, the content of this specification should not be construed as a limitation to the present disclosure.

What is claimed is:

1. A display panel, wherein the display panel comprises a display area and a redundant pixel area located on at least one side of the display area, and the display panel comprises:
   a substrate;

a power supply wire disposed on the substrate, wherein the power supply wire comprises a first power supply wire located in the redundant pixel area;
an anode disposed on the power supply wire;
a light-emitting function layer disposed on the power supply wire, wherein the light-emitting function layer covers the display area and the redundant pixel area; and
a cathode disposed on the light-emitting function layer and electrically connected to the power supply wire;
wherein the redundant pixel area is provided with a plurality of redundant sub-pixels, each of the redundant sub-pixels comprises a metal pattern, and the first power supply wire is formed by a connection of the metal patterns of at least two adjacent redundant sub-pixels; and
a source-drain metal layer is provided between the substrate and the anode, and the source-drain metal layer comprises the metal patterns.

2. The display panel of claim 1, wherein the source-drain metal layer comprises redundant source electrodes and redundant drain electrodes, and the redundant sub-pixels comprise the redundant source electrodes and the redundant drain electrodes, the redundant source electrode of one of the redundant sub-pixels and the redundant source electrodes of adjacent redundant sub-pixels are connected to form the metal pattern; and
the redundant drain electrode of one of the redundant sub-pixels and the redundant drains of adjacent redundant sub-pixels are connected to form the metal pattern.

3. The display panel of claim 1, wherein the display panel comprises at least one trench located in the redundant pixel area, and the trench exposes the power supply wire; and
wherein an undercut structure is provided at a bottom of the trench, the light-emitting function layer and the cathode are disconnected at the undercut structure, and a part of the cathode covers a sidewall of the trench and is connected to the power supply wire.

4. The display panel of claim 3, wherein the display panel comprises an insulating layer and a conductive layer sequentially disposed on the power supply wire, and the conductive layer is located on a side of the light-emitting function layer away from the cathode, wherein the conductive layer comprises a protruding portion extending into the trench and suspended relative to the insulating layer, and the protruding portion, a sidewall of the insulating layer, and a surface of the power supply wire define and form the undercut structure.

5. The display panel of claim 4, wherein the display panel comprises a passivation layer, a planarization layer, the conductive layer, and a pixel defining layer sequentially disposed on the power supply wire, and the pixel defining layer is located on the side of the light-emitting function layer away from the cathode, and the trench penetrates the cathode, the light-emitting function layer, the pixel defining layer, the conductive layer, the planarization layer, and the passivation layer; and
wherein the protruding portion extends into the trench and is suspended relative to the passivation layer, and the protruding portion, a sidewall of the passivation layer, and the surface of the power supply wire define and form the undercut structure.

6. The display panel of claim 4, wherein the display panel comprises a passivation layer, the conductive layer, a planarization layer, the anode, and a pixel defining layer sequentially disposed on the power supply wire, and the pixel defining layer is located on the side of the light-emitting function layer away from the cathode, and the trench penetrates the cathode, the light-emitting function layer, the pixel defining layer, the anode, the planarization layer, the conductive layer, and the passivation layer; and
wherein the protruding portion extends into the trench and is suspended relative to the passivation layer, and the protruding portion, the sidewall of the passivation layer, and the surface of the power supply wire define and form the undercut structure.

7. The display panel of claim 1, wherein the power supply wire is disposed in the redundant pixel area.

8. The display panel of claim 1, wherein the display panel further comprises a peripheral area adjacent to the redundant pixel area, and the peripheral area is located on a side of the redundant pixel area away from the display area; and
wherein the power supply wire comprises a second power supply wire, the second power supply wire is located in the peripheral area, and the second power supply wire is connected to the first power supply wire.

9. A display panel, wherein the display panel comprises a display area, a redundant pixel area, and a peripheral area, wherein the redundant pixel area is located on at least one side of the display area, the peripheral area is disposed adjacent to the redundant pixel area and located on a side of the redundant pixel area away from the display area, and the display panel comprises:
a substrate;
a power supply wire disposed on the substrate, wherein the power supply wire comprises a first power supply wire and a second power supply wire, the first power supply wire is located in the redundant pixel area, the second power supply wire is located in the peripheral area, and the second power supply wire is connected to the first power supply wire;
an anode disposed on the power supply wire;
a light-emitting function layer disposed on the first power supply wire, wherein the light-emitting function layer covers the display area and the redundant pixel area;
a cathode disposed on the light-emitting function layer and electrically connected to the first power supply wire; and
at least one trench disposed in the redundant pixel area, wherein the at least one trench exposes the first power supply wire;
wherein the redundant pixel area is provided with a plurality of redundant sub-pixels, each of the redundant sub-pixels comprises a metal pattern, and the first power supply wire is formed by a connection of the metal patterns of at least two adjacent redundant sub-pixels; and
a source-drain metal layer is provided between the substrate and the anode, and the source-drain metal layer comprises the metal patterns.

10. An electronic device, wherein the electronic device comprises a display panel, and the display panel comprises a display area and a redundant pixel area located on at least one side of the display area, wherein the display panel comprises:
a substrate;
a power supply wire disposed on the substrate, wherein the power supply wire comprises a first power supply wire located in the redundant pixel area;
an anode disposed on the power supply wire;
a light-emitting function layer disposed on the power supply wire, wherein the light-emitting function layer covers the display area and the redundant pixel area; and a cathode disposed on the light-emitting function layer and electrically connected to the power supply wire;

wherein the redundant pixel area is provided with a plurality of redundant sub-pixels, each of the redundant sub-pixels comprises a metal pattern, and the first power supply wire is formed by a connection of the metal patterns of at least two adjacent redundant sub-pixels; and a source-drain metal layer is provided between the substrate and the anode, and the source-drain metal layer comprises the metal patterns.

11. The electronic device of claim 10, wherein the source-drain metal layer comprises redundant source electrodes and redundant drain electrodes, the redundant sub-pixels comprise the redundant source electrodes and the redundant drain electrodes, and the redundant source electrode of one of the redundant sub-pixels and the redundant source electrodes of adjacent redundant sub-pixels are connected to form the metal pattern; and the redundant drain electrode of one of the redundant sub-pixels and the redundant drains of adjacent redundant sub-pixels are connected to form the metal pattern.

12. The electronic device of claim 10, wherein the display panel comprises at least one trench located in the redundant pixel area, and the trench exposes the power supply wire; and wherein an undercut structure is provided at a bottom of the trench, the light-emitting function layer and the cathode are disconnected at the undercut structure, and a part of the cathode covers a sidewall of the trench and is connected to the power supply wire.

13. The electronic device of claim 12, wherein the display panel comprises an insulating layer and a conductive layer sequentially disposed on the power supply wire, and the conductive layer is located on a side of the light-emitting function layer away from the cathode, wherein the conductive layer comprises a protruding portion extending into the trench and suspended relative to the insulating layer, and the protruding portion, a sidewall of the insulating layer, and a surface of the power supply wire define and form the undercut structure.

14. The electronic device of claim 13, wherein the display panel comprises a passivation layer, a planarization layer, the conductive layer, and a pixel defining layer sequentially disposed on the power supply wire, and the pixel defining layer is located on the side of the light-emitting function layer away from the cathode, and the trench penetrates the cathode, the light-emitting function layer, the pixel defining layer, the conductive layer, the planarization layer, and the passivation layer; and wherein the protruding portion extends into the trench and is suspended relative to the passivation layer, and the protruding portion, a sidewall of the passivation layer, and the surface of the power supply wire define and form the undercut structure.

15. The electronic device of claim 10, wherein the power supply wire is disposed in the redundant pixel area.

16. The electronic device of claim 10, wherein the display panel further comprises a peripheral area adjacent to the redundant pixel area, and the peripheral area is located on a side of the redundant pixel area away from the display area; and wherein the power supply wire comprises a second power supply wire, the second power supply wire is located in the peripheral area, and the second power supply wire is connected to the first power supply wire.

* * * * *